United States Patent [19]

Borden et al.

[11] 4,224,369
[45] Sep. 23, 1980

[54] METHOD FOR COATING OR PRINTING USING ACRYLATED EPOXIDIZED SOYBEAN OIL URETHANE COMPOSITIONS

[75] Inventors: George W. Borden, Niantic, Conn.; Oliver W. Smith, South Charleston, W. Va.; David J. Trecker, Old Lyme, Conn.

[73] Assignee: Union Carbide Corporation, New York, N.Y.

[21] Appl. No.: 521,511

[22] Filed: Nov. 6, 1974

Related U.S. Application Data

[62] Division of Ser. No. 343,694, Mar. 22, 1973, which is a division of Ser. No. 103,912, Jan. 4, 1971, abandoned.

[51] Int. Cl.$^2$ ............................................. B05D 3/06
[52] U.S. Cl. .............................. 428/203; 204/159.23; 260/23 AR; 260/23 TN; 427/53.1; 427/54.1; 428/423.1; 428/514; 428/425.8; 430/945
[58] Field of Search ................................ 427/44, 53, 54; 204/159.22, 159.23; 260/23 AR, 23 EP, 23 TN; 428/203, 425, 514

[56] References Cited

U.S. PATENT DOCUMENTS

| | | | |
|---|---|---|---|
| 3,125,592 | 3/1964 | Nevin | 260/23 AR |
| 3,224,989 | 12/1965 | Nevin | 260/23 AR |
| 3,256,225 | 6/1966 | Nevin | 260/23 AR |
| 3,450,613 | 6/1969 | Steinberg | 204/159.23 |
| 3,650,669 | 3/1972 | Osborn et al. | 204/159.23 |
| 3,673,140 | 6/1972 | Ackerman et al. | 260/22 TN |
| 3,713,864 | 1/1973 | Ackerman et al. | 427/54 |
| 3,715,293 | 2/1973 | Sandner et al. | 204/159.23 |
| 3,801,329 | 4/1974 | Sandner et al. | 204/159.23 |

*Primary Examiner*—John H. Newsome
*Attorney, Agent, or Firm*—Francis M. Fazio

[57] ABSTRACT

The urethane derivatives of acrylated epoxidized soybean oil, which is the reaction product of epoxidized soybean oil with acrylic acid or methacrylic acid, are produced by the reaction of acrylated epoxidized soybean oil with an organic isocyanate. The derivatives are useful alone, or in conjunction with a photosensitizer, and/or a pigment as inks and coatings in the methods of this invention whereby they are cured by exposure to radiation.

12 Claims, No Drawings

METHOD FOR COATING OR PRINTING USING ACRYLATED EPOXIDIZED SOYBEAN OIL URETHANE COMPOSITIONS

This application is a division of Ser. No. 343,694, filed Mar. 22, 1973, which was a division of Ser. No. 103,912, filed Jan. 4, 1971, now abandoned.

BACKGROUND OF THE INVENTION

The epoxide derivatives of esters of soybean oil are known; also known are the acrylyl derivatives thereof. Such derivatives has also been used in the production of epoxide resins and in coating compositions; however, the coatings do not meet all of the requirements necessary in today's advanced technology.

SUMMARY OF THE INVENTION

It has now been found that certain urethane derivatives of acrylated epoxidized soybean oil compounds and certain amine derivatives of acrylated epoxidized soybean oil compounds can be produced and that such derivatives are in themselves useful as coatings, adhesives, molding compositions, and the like, or they can be used in combination with other materials to produce compositions that are similarly useful.

DESCRIPTION OF THE INVENTION

The urethane derivatives of the acrylated epoxidized soybean oil compounds are produced by the reaction of an organic mono- or poly-osocyanate with the acrylated epoxidized soybean oil compound. Among the isocyanates that can be used in producing these derivatives are those represented by the general formula:

$$R(NCO)_x$$

wherein R can be an alkyl group of from 1 to about 15 carbon atoms, a substituted or unsubstituted mono- or polycycloalkyl group of from 5 to about 12 carbon atoms, or a substituted or unsubstituted aryl group having from 6 to about 12 carbon atoms. Illustrative thereof one can mention methyl isocyanate, ethyl isocyanate, butyl isocyanate, 2-ethylhexyl isocyanate, chloroethyl isocyanate, cyclohexyl isocyanate, phenyl isocyanate, p-chlorophenyl isocyanate, benzyl isocyanate, naphthyl isocyanate, o-ethylphenyl isocyanate, 2,4-tolylene diisocyanate, 2,6-tolylene diisocyanate, 4,4'-diphenylmethane diisocyanate, polymethylene polyphenylisocyanate, dianisidine diisocyanate, 1,6-hexane diisocyanate, m-xylylene diisocyanate, dicyclohexyl-4,4'-methane diisocyanate, cyclohexane-1,4-diisocyanate, 1,5-naphthalene diisocyanate, 1-isocyanato-3-isocyanatomethyl-3,3,5-trimethylcyclohexane, diphenylene-4,4-diisocyanate, bicyclo[2.2.1]hept-2-en-5-isocyanate, and the like. Any of the known organic isocyanates can be used, including the tri- and tetra-isocyanate compounds; all of these are well known to those skilled in the art.

As previously indicated, the acrylated epoxidized soybean oil compounds are known. These compounds, and the methods for their production, have been disclosed in U.S. Pat. No. 3,125,592 and U.S. Pat. No. 3,450,613; the teachings therein are incorporated herein by reference. As is readily apparent, one can produce such compounds by the reaction of the epoxidized soybean oil with acrylic acid or methacrylic acid; both are included within the scope of this invention but for convenience the discussion will be based on the use of acrylic acid.

The reaction of the epoxidized soybean oil with acrylic acid proceeds with the opening of the epoxide ring in the molecule and the addition of acrylic acid; this can be represented by the equation:

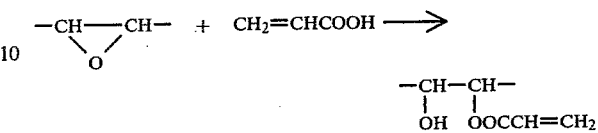

The methacrylyl group may be present instead of the acrylyl group. Thus, the acrylated epoxidized soybean oil compound contains an average of at least two such acrylyl groups per molecule and, in addition, it may also contain some unreacted oxirane, preferably less than two weight percent unreacted oxirane.

The reaction of the acrylated epoxidized soybean oil compound with the isocyanato group is via the hydroxyl group to form a urethane link. Thus, the urethane derivatives of the acrylated epoxidized soybean oil contain the group:

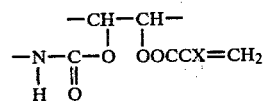

where X is hydrogen or methyl. The number of such groups present can be controlled by the amount of isocyanate compound added to the reaction. All of the hydroxyl groups in the acrylated epoxidized soybean oil can be reacted with an isocyanato group, or less than all can be so reacted. Thus, from about 2 to about 100 percent of the available hydroxyl groups can be converted to urethane groups; preferably from about 50 to about 90 percent thereof are reacted with the isocyanato group and converted to the urethane group. The polyisocyanates may react in intramolecular fashion with two hydroxyl groups on the same acrylated epoxidized soybean oil molecule or they may serve to bridge or crosslink two of such molecules. It was observed that increased mono-urethane content in general provided enhanced toughness, and mar and water resistance, and decreased viscosity; while increased intermolecular poly-urethane content in the molecule in general provided increased viscosity, increased crosslink density, increased toughness and faster cure speed.

The reaction between the acrylated epoxidized soybean oil and the isocyanate can typically be carried out by the slow addition of the isocyanate to the acrylated epoxidized soybean oil compound. The order of addition, however, is not critical. The temperature can be from about 10° C., to about 100° C., preferably from about 20° C. to about 80° C., and most preferably from about 40° C. to about 60° C. After the addition has been completed, the reaction mixture is stirred to ensure completion of reaction. The time required will vary, of course, depending upon the size of the batch, the reactants used, the temperature of the reaction and other variables known to affect chemical reactions in general. A solvent can be present if desired. It is preferably an inert solvent that will not interfere with the reaction; these are well known and include ethers, hydrocarbons, ketones and esters such as diethyl ether, p-dioxane, dibutyl ether, tetrahydrofuran, diisopropyl ether, methyl ethyl ketone, methyl n-propyl ketone, methyl propionate, ethyl acetate, hexane, toluene, xylene, benzene, and the like. Of course, the presence of water is known to be detrimental when an isocyanate group is involved since this group reacts readily and rapidly with water. Any one of the conventional catalysts known to promote the reaction of an isocyanato group with a reactive hydrogen atom of the hydroxyl group, can be used. The number of such catalysts is large, and illustrative thereof one can mention triethylamine, N,N,N',N'-tetramethylbutane-1,3-diamine, dibutyltin dilaurate, stannous octoate, stannous laurate, dioctyltin diacetate, lead octoate, bis[2-(N,N-dimethylamino)ethyl]ether, 1,4-diazabicyclo[2.2.2]octane, and the like.

In the reaction of the acrylated epoxidized soybean oil compound with an amine compound, the amine compound is preferably a secondary amine of the formula $R_2'NH$, wherein each $R'$ can be substituted or unsubstituted alkyl having from 1 to about 15 carbon atoms, or an aryl group having up to 15 carbons, or the $R_2'$ unit together with the nitrogen atom of the NH group forms a ring structure having 5 or 6 ring atoms. Illustrative thereof one can mention dimethylamine, diethylamine, dibutylamine, dioctylamine, di-2-ethylhexylamine, diphenylamine, N-metyl-N-phenylamine, morpholine, piperidine, pyrrolidine, and the like. In this reaction the amine compound adds across the double bond of the acrylyl unit of the acrylated epoxidized soybean oil compound to produce a compound containing the group

The reaction between the secondary amine and the acrylated epoxidized soybean oil can be carried out by mixing the two compounds together and stirring at a temperature of from about 10° C. to about 100° C.; ambient temperatures are preferred, thus eliminating any need for temperature control facilities. The amount of amine added can be an amount sufficient to react with from about 5 to 40 percent of the acrylyl groups present. If desired, an inert solvent, such as those heretofore mentioned, can also be present.

The urethane derivatives of the acrylated epoxidized soybean oil and the amine derivatives of the acrylated epoxidized soybean oil can be used per se as coating compositions, either alone or in admixture with conventional solvents, pigments, fillers or other additives. They can be applied by conventional means and cured by exposure to heat, light, electron radiation, X-ray radiation, and other known means for curing and crosslinking a polymer, either alone or in the presence of a crosslinker.

The acrylated epoxidized soybean oil compounds, the urethane derivatives thereof and the amine derivatives thereof can also be used to produce coating compositions known as 100 percent reactive coating compositions by mixing them with a reactive solvent. These reactive solvents are well known to those skilled in the art and include olefinic monomers such as styrene, alpha-methylstyrene, p-methylstyrene, p-chlorostyrene, and acrylyl compounds such as the acrylate esters, the methacrylate esters, the acrylamides and the methacrylamides. These acrylyl compounds can be represented by the formula:

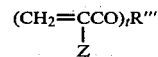

wherein Z is hydrogen or methyl; t is an integer having a value of 1 to 3; and $R'''$ is alkoxy having from 1 to about 18 carbon atoms (e.g., methoxy, ethoxy, propoxy, isopropoxy, 2-methylhexoxy, 2-ethylhexoxy, decoxy, octadecoxy); hydroxyalkoxy having up to about 15 carbon atoms (e.g., hydroxymethoxy, hydroxyethoxy, hydroxypropoxy, hydroxydecoxy); alkoxyalkoxy having up to a total of about 15 carbon atoms (e.g., methoxymethoxy, methoxyethoxy, ethoxybutoxy, methoxypropoxy, decoxypentoxy); cyano; cyanoalkoxy having up to about 15 carbon atoms (e.g., cyanomethoxy, cyanobutoxy, cyanodecoxy); aryloxy (e.g., phenoxy, toloxy, xyloxy, phenoxyethoxy, naphthoxy, benzyloxy); or an $-(OC_nH_{2n})_zNR''''_2$ group wherein n is an integer having a value of 1 to 10, z has a value of 0 or 1 and $R''''$ is alkyl having 1 to 10 carbon atoms when t is one or polyvalent alkylene or oxyalkylene having 2 to 8 carbon atoms in the alkylene moiety thereof when t is other than one.

Illustrative of suitable acrylyl compounds, many more of which are well known in the art, one can mention methyl acrylate, ethyl acrylate, 2-ethylhexyl acrylate, methoxyethyl acrylate, butoxyethyl acrylate, butyl acrylate, methoxybutyl acrylate, cyano acrylate, cyanoethyl acrylate, phenyl acrylate, methyl methacrylate, propyl methacrylate, methoxyethyl methacrylate, ethoxymethyl methacrylate, phenyl methacrylate, ethyl methacrylate, lauryl methacrylate, N,N-dimethyl acrylamide, N,N-diisopropyl acrylamide, N,N-didecyl acrylamide, N,N-dimethyl methacrylamide, N,N-diethyl methacrylamide, (N,N-dimethylamino)methyl acrylate, 2-(N,N-dimethylamino)ethyl acrylate, 2-(N,N-dipentylamino)ethyl acrylate, (N,N-dimethylamino)methyl methacrylate, 2-(N,N-diethylamino)propyl acrylate, ethylene glycol diacrylate, propylene glycol diacrylate, neopentyl glycol diacrylate, 1,6-hexanediol diacrylate, diethylene glycol diacrylate, triethylene glycol diacrylate, dipropylene glycol diacrylate, ethylene glycol diacrylate, ethylene glycol dimethacrylate, propylene glycol dimethacrylate, diethylene glycol dimethacrylate, tripropylene glycol diacrylate, trimethylolpropane triacrylate, pentaerythritrol triacrylate, and the like.

The concentration of reactive solvent in the 100 percent reactive coating composition can be from zero to about 90 weight percent, with from 5 to 60 weight percent preferred, and from 10 to 50 weight percent most preferred.

When the coating compositions are to be cured by light means they can contain from about 0.1 to about 10 weight percent of an activator such as any of the known photosensitizers or photoinitiators, preferably at a concentration of from about one to about 5 weight percent. These can be added singly or in mixtures and include, for example, benzophenone, p-methoxybenzophenone, acetophenone, m-chloroactophenone, propiophenone, xanthone, benzoin, benzil, benzaldehyde, naphthoquinone, anthraquinone, benzoin butyl ether, and the like.

If desired, an amine can also be present to further accelerate curing by light radiation when the photoinitiator is an aryl ketone. Amines that show this synergistic rate-enhancing effect include triethanolamine, triisopropanolamine, methyldiethanolamine, tributylamine, triethylamine and the like.

The photoinitiators or photosensitizers are usually present at a concentration of from about 0.1 to about 10 weight percent, preferably from about 1 to about 5 weight percent, based on the weight of the composition. The amine accelerator, when present, is preferably present at a concentration of from about 1 to about 10 weight percent, and can be as high as 25 weight percent of the composition.

The coating compositions are produced by conventional methods by mixing the selected components together. To facilitate preparation one can apply a small amount of heat. The coatings can be applied by conventional means, including spray, curtain, dip, pad, rollcoating and brushing procedures. They may, if desired, be dried under ambient or oven conditions. The coatings can be applied to any acceptable substrate such as wood, metal, glass, fabric, paper, fiber, plastic that is in any form, e.g., sheet, coil, molded, film, panel, tube, etc.

The coating compositions containing the urethane derivatives of acrylated epoxidized soybean oil or the amine derivatives of epoxidized soybean oil can be cured by exposure to heat or radiation, either before or after the coating has dried. The radiation can be ionizing radiation, either particulate or non-particulate, or non-ionizing radiation. As a suitable source of particulate radiation, one can use any source which emits electrons or charged nuclei. Particulate radiation can be generated from electron accelerators such as the Van de Graaff accelerator, resonance transformers, linear accelerators, insulating core transformers, radioactive elements such as cobalt-60, strontium-90, etc. As a suitable source of non-particulate ionizing radiation, one can use any source which emits light radiation in the range of from about $10^{-3}$ Ångstroms, to about 2000 Ångstroms, preferably from about $5 \times 10^{-3}$ Ångstroms to about 1 Ångstrom. Suitable sources are vacuum ultraviolet lamps, such as xenon or krypton arcs, and radioactive elements such as cesium-137, strontium-90 and cobalt-60. The nuclear reactors are also known to be a useful source of such radiation. As a suitable source of non-ionizing radiation, one can use any source which emits radiation of from about 2000 Ångstroms to about 4000 Ångstroms, such as mercury arcs, carbon arcs, tungsten filament lamps, xenon arcs, krypton arcs, sunlamps, lasers, and the like. All of these devices and sources are well known in the art and those skilled in radiation technology are fully aware of the manner in which the radiation is generated and the precautions to be exercised in its use.

The use of low to high pressure mercury lamps to generate ultraviolet light is known. The largest such mercury lamp of commercial utility is generally about five feet long, having a diameter of about one to two inches and an electrical input of about 20 kilowatts. Mercury lamps generate a typical ultraviolet light line structure.

The ionizing radiation dosage necessary to effect curing or crosslinking of the coating composition will vary depending upon the composition of the particular coating that is undergoing radiation, the extent of crosslinking desired, the number of crosslinkable sites available and the molecular weight of the starting polymer in the coating composition. The total dosage will generally be from about $10^3$ rads to $10^8$ rads, preferably from $5 \times 10^5$ rads to $10^7$ rads. A rad is 100 ergs of ionizing energy absorbed per gram of material being irradiated.

Recently a source of light radiation emitting high intensity predominantly continuum light radiation containing ultraviolet, visible and infrared radiation was discovered that can be used to polymerize monomers and to crosslink polymer compositions, namely the swirl-flow plasma arc radiation source. By means of proper light filters on this source one can selectively screen out a portion of the light radiation emitted, permitting only that wavelength portion desired to reach the material being treated.

The term "high intensity predominantly continuum light radiation" means continuum radiation with a source intensity of at least 350 watts per square centimeter steradian (about 1000 kilowatts per square foot of source projected area) having only a minor part of the energy in peaks of bandwidths less than 100 Ångstrom units, with less than about 30 percent of the light radiated having wavelengths shorter than 4,000 Ångstrom units and at least about 70 percent of the light energy radiated having wavelengths longer than 4,000 Ångstrom units.

This form of high intensity continuum light radiation is derived from an artificial source that generates high intensity predominantly continuum light radiation with a source intensity of at least about 350 watts per square centimeter steradian, as abbrevated by the term: watts $cm^{-2}$ $sr^{-1}$. Said high intensity predominantly continuum artificial light radiation generally has about 70 percent of the light radiated at a wavelength longer than 4,000 Ångstroms and less than about 30 percent of the light radiated having a wavelength shorter than 4,000 Ångstroms, usually, however, about 80 percent of the light radiated has a wavelength longer than 4,000 Ångstroms and less than about 20 percent of the light radiated has a wavelength shorter than 4,000 Ångstroms, and the source intensity can vary from about 350 watts (about 1000 kilowatts per square foot of source projected area) to about 5,000 watts (about 15,000 kilowatts per square foot of source projected area) or more per square centimeter steradian. A convenient source of high intensity predominantly continuum light radiation is a swirl-flow plasma arc light radiation apparatus. The equipment for generating high intensity predominantly continuum light radiation by this means is known and available; many different forms thereof are described in the literature. A highly efficient apparatus for obtaining high intensity predominantly continuum light radiation is the swirl-flow plasma arc radiation source described in U.S. Pat. No. 3,364,387. The apparatus or equipment necessary for generating the light radiation is not the subject of this invention and any source or apparatus capable of generating high intensity predominantly continuum light radiation can be used.

While any artificial source of generating high intensity predominantly continuum light radiation can be used, as previously indicated the swirl-flow plasma arc radiation apparatus is most convenient. Any apparatus that operates according to the known principles of the swirl-flow plasma arc radiation source can be used to produce the high intensity predominantly continuum light radiation useful in the curing or crosslinking processes of this invention. These apparatuses are often known by other terms but those skilled in this art recognize that they emit high intensity predominantly continuum light radiation. The source of radiation in a 50 kilowatt swirl-flow plasma arc radiation source is an arc only about four inches long enclosed in a quartz envelope about 1.5 inches in diameter. This lamp can be readily removed and refurbished and has an acceptable long lifetime. Further, a swirl-flow plasma arc radiation apparatus having a 250-kilowatt rating would be only about two or three times as large as a 50-kilowatt source. Another advantage is the absence of a need for expensive radiation shielding. Precautions required for the artificial light sources include those needed to protect one's eyes from the intense visible light and from the ultraviolet light present to prevent inadvertent sunburn effect on the body.

It is to be noted that in the spectra of high intensity predominantly continuum light radiation there is a continuum of radiation throughout the entire spectral range. This type of continuum radiation in the ultraviolet range has not heretofore been obtainable from the conventional commercial mercury arcs of lamps generally available for generating ultraviolet light. The previously known means for generating ultraviolet light produced light that shows a line or peak spectrum in the ultraviolet range, it is not a continuum spectrum in the ultraviolet range. In a line spectrum the major portion of useable ultraviolet light is that portion at which the line or band in the spectrum forms a peak; in order for such energy to be useful the material or composition that is to be treated with ultraviolet radiation must be capable of absorbing as that particular wavelength range at which the peak appears. In the event the material or composition does not have the ability to absorb at that particular wavelength range there is little or no absorption or reaction. Thus, in the event the material or composition to be treated absorbs at a particular wavelength range in one of the valleys of the spectral curve there will be little or no reaction since there is little or no ultraviolet energy to adequately excite the system. With a high intensity predominantly continuum radiation, there is a high intensity continuum radiation of ultraviolet energy across the entire ultraviolet wavelength range of the spectrum and there is generally sufficient ultraviolet energy generated at all useful ultraviolet wavelengths to enable one to carry out reactions responsive to ultraviolet radiation without the problem of selecting compound that will absorb at the peak wavelength bands only. With the high intensity continuum radiation now discovered one does not have the problem of being unable to react materials or compositions that absorb in the valley areas only since for all intents and purposes such valleys do not exist in high intensity continuum radiation, the high intensity radiated light energy is essentially a continuum, it is not in peak bands.

High intensity predominantly continuum light radiation is to be distinguished from ultraviolet radiation generated by commercially available low, medium and high pressure mercury arc ultraviolet lamps. These mercury arc lamps produce light emission which is primarily line or peak rather than continuum light, wherein a major part of the light appears in bands narrower than 100 Ångstrom units, and much less than 70 percent is above 4,000 Ångstrom units.

As is known, high intensity predominantly continuum light radiation from a swirl-flow plasma arc radiation source is emitted from an arc generated between a pair of electrodes that are lined up axially and encased in a quartz cylinder. In an embodiment a pair of concentric quartz cylinders between which cooling water or gas flows is used. A rare gas, such as argon, krypton, neon or xenon, introduced into the inner cylinder tangentially through inlets located at one end of the inner cylinder creates a swirling flow or vortex which restricts the arc to a small diameter. An electrical potential applied across the electrodes causes a high density current to flow through the gas to generate a plasma composed of electrons, positively charged ions and neutral atoms. A plasma generated in the above gases produces high intensity predominantly continuum light radiation with diffuse maxima in the region of from about 3,000 to about 6,000 Angstroms. The radiation source can also be used with reflectors or refractive optical systems to direct the high intensity predominantly continuum light radiation emanating from the arc to a particular point or direction or geometrical area.

The coating compositions of this invention are readily cured by exposure to the radiation for a shorter period of time. The exposure can vary from a period as short as a fraction of a second to a period that may be as long as ten minutes or longer. In most instances a period of from about 0.1 second to about two minutes is adequate. The distance of the composition from the radiation source will vary depending upon the particular energy source being employed. It can vary from a fraction of an inch up to 10 feet or more; preferably the distance is from about one foot to about 4 feet. Exposure can be under normal atmospheric conditions or under an inert gas blanket, for example under nitrogen; the preferred process includes the use of an inert gas atmosphere.

Alternatively, one can add a peroxidic compound, a perester, peracid, peroxide, hydroperoxide, or a persulfate or azo compound to the composition and then cure or crosslink by heating at from about 50° C. to about 250° C. The amount of such compound added can vary from about 0.1 to about 10 weight percent, preferably 0.5 to about 2.5 weight percent, of the composition. Any of these compounds known to be useful in the curing of polymer compositions can be used, such as, di-t-butyl peroxide, dicumyl peroxide, t-butyl hydroperoxide, alpha-tetralin hydroperoxide, t-butyl peracetate, peracetic acid, perbenzoic acid, benzoyl peroxide, dichlorobenzoyl peroxide, ammonium persulfate, azobis-(isobutyronitrile), dimethyl azobis(isobutyrate), and the like.

ILLUSTRATIVE EXAMPLES

PREPARATION OF ACRYLATED EPOXIDIZED SOYBEAN OIL COMPOUNDS

Example 1

A mixture was prepared containing 300 parts by weight of a commercially available epoxidized soybean oil and 47.5 parts by weight of acrylic acid. The epoxidized soybean oil had an average molecular weight of about 1,000, an oxirane content of about 7 percent by weight and it was the epoxide of the triester of glycerol with soybean oil. The mixture was heated at 40° C. for 70 hours and then cooled. The reaction product contained 38.6 parts of unreacted acrylic acid with the balance of the reaction product being acrylated epoxidized soybean oil having an oxirane content of 5.2 percent and an acrylyl content of 0.354 milliequivalents per gram.

Example 2

A mixture was prepared using 250 parts of the same epoxidized soybean oil used in Example 1 and 216 parts of acrylic acid; and it was then stirred at 125° C. for one hour in an open reaction vessel. After cooling to room temperature it was diluted with diethyl ether. The mixture was washed several times with one percent aqueous sodium acid phosphate and then with one percent aqueous sodium chloride solutions. The diethyl ether was removed in vacuo and the product dried. The reaction product contained 49 parts of unreacted acrylic acid and the balance, 417 parts, was acrylated epoxidized soybean oil having an oxirane content of 0.2 percent, an acrylyl content of 2.2 milliequivalents per gram and a viscosity of 1,500 centistokes at 25° C. by the Gardner method.

Example 3

A mixture was prepared using 100 grams of the same epoxidized soybean oil used in Example 1, 400 grams of ethylbenzene and 0.2 gram of tridecylphosphite; it was stirred at 90° C. under a nitrogen purge for one hour. Five hundred grams of acrylic acid, 0.006 gram of phenothiazine, 0.056 gram of hydroquinone and 0.025 gram of alloocimene were added to the above mixture and stirring was continued for another three hours at 90° C. to 100° C. while purging with oxygen. The unreacted acrylic acid and the solvent were removed by flash distillation under vacuum at 120° C. The acrylated epoxidized soybean oil had an oxirane content of 0.93 percent, an acrylyl content of 2.1 milliequivalents per gram and a viscosity of 1,850 centistokes at 100° F. by the Gardner method; the distilled product also contained 0.54 percent unreacted acrylic acid.

Example 4

Two liters of the epoxidized soybean oil used in Example 1, 8 liters of acrylic acid, 8 grams of hydroquinone, 2 grams of p-methoxyphenol and 0.5 gram of phenothiazine were charged to a reaction flask and reacted at 100° C. to 110° C. for five hours while continuously purging dry air through the mixture. The unreacted acrylic acid was distilled under vacuum on a rotary film evaporator and the residual product was diluted with diethyl ether. The solution was passed through a column of amine containing ion exchange resin sold commercially as A-21 (Rohm & Haas) and then distilled to remove the diethyl ether. The acrylated epoxidized soybean oil was a straw yellow color and was free of unreacted acrylic acid.

PREPARATION OF URETHANE DERIVATIVES OF ACRYLATED EPOXIDIZED SOYBEAN OIL COMPOUNDS

Example 5

One hundred parts by weight of acrylated epoxidized soybean oil, produced as described in Example 4, were mixed with 10 parts of methyl isocyanate, 30 parts of anhydrous tetrahydrofuran and 0.05 part of dibutyltin dilaurate in an amber glass bottle and the bottle was sealed. The mixture was agitated at room temperature for twelve hours. The urethane of the acrylated epoxidized soybean oil contained units of the following formula in the molecule:

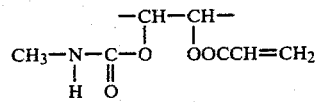

This structure was confirmed by infrared analysis. The amber-colored urethane had a viscosity of 1,000 poises.

Example 6

Two hundred parts by weight of acrylated epoxidized soybean oil, produced as described in Example 4, were dissolved in 100 parts of diethyl ether and then 6 parts of an 80/20 mixture of the 2,4- and 2,6-tolylenediisocyanate isomers and 0.05 part of dibutyltin dilaurate were added. After agitating in a closed vessel at room temperature for 12 hours the diethyl ether ws distilled under vacuum. The amber-colored urethane had a viscosity of 110 poises. The structure of the urethane of the acrylated epoxidized soybean oil was confirmed by infrared spectrum; it contained units of the following formula in the molecule:

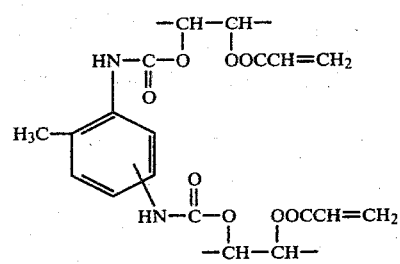

Example 7

Ninety five parts by weight of acrylated epoxidized soybean oil, produced as described in Example 4, were mixed with 5 parts of methylenebis-4,4'-phenyl isocyanate and 0.05 part of dibutyltin dilaurate and agitated at 50° C. in a closed reactor for 16 hours. The yellow urethane of the acrylated epoxidized soybean oil had a Brookfield viscosity of 3,300 centiposies at 25° C. and contained units of the following formula:

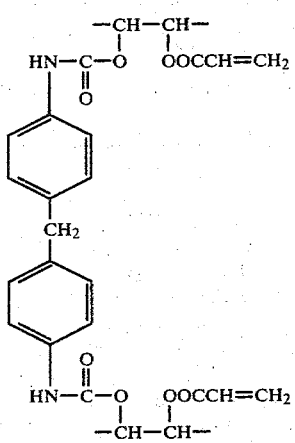

PREPARATION OF AMINE DERIVATIVES OF ACRYLATED EPOXIDIZED SOYBEAN OIL COMPOUNDS

Example 8

Ninety seven parts by weight of acrylated epoxidized soybean oil, produced as described in Example 4, were reacted with three parts of diethanolamine in a closed vessel for one hour. The aminated acrylated epoxidized soybean oil was light yellow and it had a Brookfield viscosity of 17,900 centipoises at 25° C. Analysis indicated that about 14 percent of the double bonds of the acrylyl group had reacted with the diethanolamine; the compound contained units of the formula:

Example 9

In a manner similar to that described in Example 8, 97 parts of the acrylated epoxidized soybean oil and 3 parts of morpholine were reacted at 25° C. for one hour. The morpholine adduct of the acrylated epoxidized soybean oil was amber in color and it had a Brookfield viscosity of 19,000 centipoisies at 25° C. Analysis indicated that about 14 percent of the double bonds of the acrylated epoxidized soybean oil had reacted with the morpholine; the compound contained units of the formula:

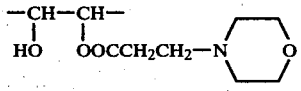

PREPARATION OF COATING COMPOSITIONS

Example 10

The urethane of acrylated epoxidized soybean oil, produced as described in Example 6 by the reaction of acrylated soybean oil with two weight percent of an 80/20 mixture of 2,4- and 2,6- tolylenediisocyanate, was coated on steel panels. The panels were placed in a flat box covered with polyethylene film, purged with nitrogen and irradiated with electrons from a 300 kilovolt electron accelerator to impart a dose of 0.5 megarad to the coating. The coating cured to hard, tough surfaces having the following properties.

| Run | A | B |
|---|---|---|
| Sward hardness (glass = 100) | 8 | 20 |
| Reverse impact (inch-lbs) | >165 | 25 |
| Acetone resistance (rub cycles) | 16 | 50 |
| Boiling water resistance, (30 min. immersion) | good | excellent |

Example 11

Coating compositions were produced by the addition of varying amounts of 2-hydroxyethyl acrylate (HEA) to the same urethane derivative of acrylated epoxidized soybean oil used in Example 10. The coatings were applied to steel panels and were then irradiated with five megarads of high energy electrons in the same manner described in Example 10; Runs A to C. In addition, coating compositions were produced from the unmodified acrylated epoxidized soybean oil and 2-hydroxyethyl acrylate and similarly irradiated; Runs D to G. As is evident from the results, the addition of the 2-hydroxyethyl acrylate lowers the viscosity making the coating solution easier to apply, while at the same time the properties of the coatings improved with the increased concentration thereof used.

| Run | HEA wt % | Viscosity cps at 25° C. | Sward hardness glass = 100 | Reverse impact in-lbs. |
|---|---|---|---|---|
| A | 0 | 25,000 | 20 | 25 |
| B | 20 | 1,840 | 20 | 100 |
| C | 30 | 750 | 28 | 165 |
| D | 0 | 6,800 | 12 | 50 |
| E | 20 | 1,200 | 14 | 100 |
| F | 30 | 390 | 14 | >165 |
| G | 40 | 210 | 14 | >165 |

Example 12

To the acrylated epoxidized soybean oil compound of Example 7 there was added 5 weight percent of benzophenone as photosensitizer. The composition was coated on to steel panels and irradiated for sixty seconds under two side-by-side 550 watt medium pressure mercury arcs. The compositions cured to smooth, hard, clear coatings which resisted 200 acetone rub-cycles.

EXAMPLE 13

A composition was prepared containing 70 parts by weight of the acrylated epoxidized soybean oil compound prepared as described in Example 4 and 30 parts of 2-hydroxyethyl acrylate; it had a viscosity of 390 centipoises at 25° C. The composition was coated on steel panels which were irradiated as described in Example 10 with varying amounts of high energy electrons to determine the effect of varying the electron dosage on the properties of the cured film. It was found that a dose of two megarads was sufficient, a higher dose showed little further improvement. The results are tabulated below; all coatings had a reverse impact of greater than 165 in-lbs.

| Megarads | Sward hardness glass = 100 | Acetone resistance, rub-cycles | Boiling water resistance 30 min |
|---|---|---|---|
| 0.25 | 2 | 11 | fair |
| 0.5 | 8 | 15 | good |
| 1.0 | 8 | 30 | good |
| 2.0 | 14 | 46 | good |
| 5.0 | 14 | 50 | good |

Example 14

A composition was prepared containing 80 parts of acrylated epoxidized soybean oil produced as described in Example 4 and 20 parts of 2-butoxyethyl acrylate. This composition was used to produce coating compositions containing varying amounts of tricyclo[5.2.1.0$^{2,6}$]-dec-3-en-8(-9)-yl acrylate (DCPA), which were coated on steel panels and cured in the manner described in Example 10. A dosage of 2.5 megarads was applied to eacn panel. The coatings cured to smooth, clear films. All of the films had an acetone resistance of 50 rub-cycles and after 30 minutes immersion in boiling water had a boiling water resistance rating of excellent. The data is recorded below:

| DCPA wt. % | Sward hardness glass = 100 | Reverse impact, in-lbs |
|---|---|---|
| 0 | 12 | 5 |
| 12.5 | 16 | 25 |
| 25.0 | 22 | >165 |
| 37.5 | 34 | >165 |

Example 15

A composition was produced containing 95 parts by weight of the diethanolamine adduct of Example 8 and 5 parts by weight of benzophenone. The solutions were coated on steel panels and irradiated for 10 seconds as described in Example 12 to produce a clear, smooth, tack-free coating.

A composition containing 75 parts by weight of the adduct of Example 8, 20 parts by weight of neopentyl glycol diacrylate and 5 parts by weight of benzoin butyl ether cures to a clear, hard coating when it is irradiated in a similar manner.

Example 16

A coating composition was produced by mixing 95 parts by weight of the morpholine adduct of Example 9 and 5 parts by weight of benzophenone. The solution was coated on steel panels and irradiated with two side-by-side 2.2-kilowatt medium-pressure mercury arcs housed in directional reflectors placed 18 inches over and parallel to a conveyor line moving at 76 feet per minute. A single pass of the coated panel under the mercury arcs cured the composition to a clear, tack-free coating.

Example 17

Ninety five parts by weight of an acrylated epoxidized soybean oil produced as described in Example 4 and five parts by weight of benzophenone were mixed to form a uniform solution. This was coated on steel panels and irradiated as described in Example 16; three passes under the mercury arcs were required to cure the composition to a tack-free state. A comparison with Example 16 indicates that the amine adducts cure more rapidly.

What is claimed is:

1. The method of coating or printing comprising the steps of:
   (A) coating or printing on a substrate with a composition comprising:
      (I) a liquid vehicle polymerizable to a solid upon exposure to actinic radiation, said vehicle comprising a major proportion of one or more compounds selected from the group of:
         (a) the reaction product of epoxidized soybean oil and acrylic acid, having at least two acrylate groups per mole of product, with methyl isocyanate,
         (b) the reaction product of epoxidized soybean oil and acrylic acid, having at least two acrylate groups per mole of product, with tolylene diisocyanate,
      (II) a photosensitizer for said vehicle, and
      (III) a pigment,
   (B) exposing the coated or printed substrate to an amount of actinic radiation effective to polymerize said vehicle to form a solid coated or printed surface.

2. The method of claim 1 wherein the coated or printed substrate is exposed by moving it through at least one beam of actinic radiation.

3. The method of claim 1 wherein the focus of the beam of ultraviolet radiation is directed from a reflector and the coated or printed substrate is at the focal point thereof.

4. The method of claim 1 wherein the coated or printed substrate is exposed to ultraviolet radiation energy.

5. A coated or printed substrate comprising:
   (A) a substrate,
   (B) a composition on the substrate comprising the dried residue of a coating or printing composition comprising:
      (I) a liquid vehicle polymerizable to a solid upon exposure to actinic radiation, said vehicle comprising a major proportion of one or more compounds selected from the group of:
         (a) the reaction product of epoxidized soybean oil and acrylic acid, having at least two acrylate groups per mole of product, with methyl isocyanate,
         (b) the reaction product of epoxidized soybean oil and acrylic acid, having at least two acrylate groups per mole of product, with tolylene diisocyanate,
      (II) a photosensitizer for said vehicle, and
      (III) a pigment.

6. A coated or printed substrate comprising:
   (A) a substrate,
   (B) coating or printing on the substrate,
   (C) a clear layer overlying the substrate and coating or printing, comprising the dried residue of a liquid vehicle polymerizable to a solid upon exposure to actinic radiation, said vehicle comprising an actinic radiation sensitizer and a major proportion of one or more from the group of:
      (a) the reaction product of epoxidized soybean oil and acrylic acid, having at least two acrylate groups per mole of product, with methyl isocyanate,
      (b) the reaction product of epoxidized soybean oil and acrylic acid, having at least two acrylate groups per mole of product, with tolylene diisocyanate.

7. The method of coating or printing comprising the steps of:
   (A) coating or printing on a substrate with a composition comprising:
      (I) a liquid vehicle polymerizable to a solid upon exposure to actinic radiation, said vehicle comprising a major proportion of one or more compounds selected from the group of:
         (a) a liquid vehicle polymerizable to a solid upon exposure to actinic radiation comprising the reaction product of epoxidized soybean oil and acrylic acid, having at least two acrylate groups per mole of product,
         (b) the reaction product of epoxidized soybean oil and acrylic acid, having at least two acrylate groups per mole of product, with methyl isocyanate,
         (c) the reaction product of epoxidized soybean oil and acrylic acid, having at least two acrylate groups per mole of product, with tolylene diisocyanate, (II) a photosensitizer for said vehicle, and (III) a pigment, (B) exposing the coated or printed substrate to an amount of actinic radiation effective to polymerize said vehicle to form a solid coated or printed surface.

8. The method of claim 7 wherein the coated or printed substrate is exposed by moving it through at least one beam of actinic radiation.

9. The method of claim 7 wherein the focus of the beam of ultraviolet radiation is directed from a reflector and the coated or printed substrate is at the focal point thereof.

10. The method of claim 7 wherein the coated or printed substrate is exposed to ultraviolet radiation energy.

11. A coated or printed substrate comprising:

(A) a substrate, (B) a composition on the substrate comprising the dried residue of a coating or printing composition comprising:

(I) a liquid vehicle polymerizable to a solid upon exposure to actinic radiation, said vehicle comprising a major proportion of one or more compounds selected from the group of:

(a) a liquid vehicle polymerizable to a solid upon exposure to actinic radiation comprising the reaction product of epoxidized soybean oil and acrylic acid, having at least two acrylate groups per mole of product, (b) the reaction product of epoxidized soybean oil and acrylic acid, having at least two acrylate groups per mole of product, with methyl isocyanate, (c) the reaction product of epoxidized soybean oil and acrylic acid, having at least two acrylate groups per mole of product, with tolylene diisocyanate, (II) a photosensitizer for said vehicle, and (III) a pigment.

12. A coated or printed substrate comprising:

(A) a substrate, (B) coating or printing on the substrate, (C) a clear layer overlying the substrate and coating or printing, comprising the dried residue of a liquid vehicle polymerizable to a solid upon exposure to actinic radiation, said vehicle comprising an actinic radiation sensitizer and a major proportion of one or more from the group of:

(a) a liquid vehicle polymerizable to a solid upon exposure to actinic radiation comprising the reaction product of epoxidized soybean oil and acrylic acid, having at least two acrylate groups per mole of product, (b) the reaction product of epoxidized soybean oil and acrylic acid, having at least two acrylate groups per mole of product, with methyl isocyanate, (c) the reaction product of epoxidized soybean oil and acrylic acid, having at least two acrylate groups per mole of product, with tolylene diisocyanate.

* * * * *